United States Patent
Kosonocky et al.

(10) Patent No.: US 11,360,541 B2
(45) Date of Patent: Jun. 14, 2022

(54) PROGRAMMABLE VOLTAGE REGULATION FOR DATA PROCESSOR

(71) Applicant: Advanced Micro Devices, Inc., Santa Clara, CA (US)

(72) Inventors: Stephen Victor Kosonocky, Fort Collins, CO (US); Miguel Rodriguez, Golden, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 93 days.

(21) Appl. No.: 17/028,692

(22) Filed: Sep. 22, 2020

(65) Prior Publication Data

US 2021/0405725 A1  Dec. 30, 2021

Related U.S. Application Data

(60) Provisional application No. 63/044,408, filed on Jun. 26, 2020.

(51) Int. Cl.
*G06F 1/28* (2006.01)
*G06F 1/324* (2019.01)
(Continued)

(52) U.S. Cl.
CPC .............. *G06F 1/324* (2013.01); *G06F 1/08* (2013.01); *G06F 1/28* (2013.01); *G06F 1/3296* (2013.01); *H03K 5/159* (2013.01)

(58) Field of Classification Search
CPC ... G06F 1/08; G06F 1/28; G06F 1/324; G06F 1/3296; H03K 5/159
See application file for complete search history.

(56) References Cited

U.S. PATENT DOCUMENTS 6,995,549 B2    2/2006 Walters
2008/0122412 A1    5/2008 Burton et al.
(Continued)

FOREIGN PATENT DOCUMENTS

WO    2012075223 A1    7/2012

OTHER PUBLICATIONS

International Search Report and Written Opinion for International Application No. PCT/US2021/036828, dated Sep. 29, 2021, 7 pages.
(Continued)

*Primary Examiner* — Albert Wang
(74) *Attorney, Agent, or Firm* — Polansky & Associates, P.L.L.C.; Paul J. Polansky (57) ABSTRACT

A data processor includes at least one power supply voltage terminal for receiving a power supply voltage and a power supply current, a data processing circuit, a register, and a port controller. The data processing circuit is coupled to the at least one power supply voltage terminal and operates using the power supply voltage. The register stores a nominal value of the power supply voltage, an electrical design current (EDC) limit, and an EDC slope, wherein the EDC slope specifies a desired voltage-current relationship for an external voltage regulator when the power supply current exceeds the EDC limit. The port controller is coupled to the register and to an output port. The data processing circuit is operative to cause the port controller to output the nominal value of the power supply voltage, the EDC limit, and the EDC slope over the output port for use by the external voltage regulator.

31 Claims, 6 Drawing Sheets

(51) Int. Cl.
  *H03K 5/159*     (2006.01)
  *G06F 1/3296*    (2019.01)
  *G06F 1/08*      (2006.01)

(56) References Cited

U.S. PATENT DOCUMENTS

2009/0077402 A1    3/2009   Huang et al.
2013/0234691 A1*   9/2013   Carroll ................ H02M 3/1588
                                                          323/283
2015/0241955 A1    8/2015   Kosonocky et al.
2016/0357234 A1*  12/2016   Luo ...................... G06F 16/245
2017/0068296 A1    3/2017   Mair et al.
2018/0039323 A1    2/2018   Paterson et al.
2018/0054205 A1    2/2018   Petrick
2019/0199363 A1    6/2019   Kosonocky et al.

OTHER PUBLICATIONS

"VR12/IMVP7 Pulse Width Modulation (PWM) Specification"; white paper; Document No. 397113; CDI/IBL 397113; Revision 1.4; Dec. 2009; Intel Corporation, 3065 Bowers Ave., Santa Clara, CA, 95052, United States; 66 pages.

"VR12/IMVP7 Pulse Width Modulation (PWM) Specification"; white paper; Intel Corporation, 2200 Mission College Blvd.; Santa Clara, CA 95052, USA; Dec. 2009; Rev. 1.4; 66 pages.

\* cited by examiner

PROGRAMMABLE VOLTAGE REGULATION FOR DATA PROCESSOR

BACKGROUND

Modern digital integrated circuits (ICs) such as those including various types of data processors are typically implemented using complementary metal-oxide-semiconductor (CMOS) circuitry. CMOS ICs can be fabricated densely and operate using relatively low power supply voltages. In addition, CMOS ICs have relatively low power consumption, since significant current is only consumed when the internal logic circuits are switching. The dynamic power consumption of a CMOS IC is proportional to the switching frequency and the square of the voltage, given by the formula:

$$P = C \times V^2 \times f \quad [1]$$

in which P is the power consumption, C is the dynamic capacitance of the IC, V is the power supply voltage, and f is the switching frequency.

Because power consumption is related to frequency and the square of the voltage, then it follows that power consumption of CMOS ICs can be reduced by lowering the frequency and/or the power supply voltage. In practice, the lowest voltage at which a CMOS IC can operate correctly is itself a function of the frequency and increases with increasing frequency. Because power consumption is dependent on both power supply voltage and frequency, some CMOS data processors define performance states or "P-states" that identify power supply voltage and frequency pairs that the CMOS data processor is capable of operating in, and a power management mechanism that changes between different P-states based on the changing processing needs of the system.

Voltage "droop" refers to the drop in voltage from the desired voltage level as the power supply drives a rapidly increasing load. In a regulated system, the power supply voltage can sag or droop when a load is suddenly increased very rapidly before the voltage regulator corrects for the droop. If the droop is too large, then circuit failure results because the data processor cannot operate correctly at the current frequency using the droopy voltage.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

Figure 2:
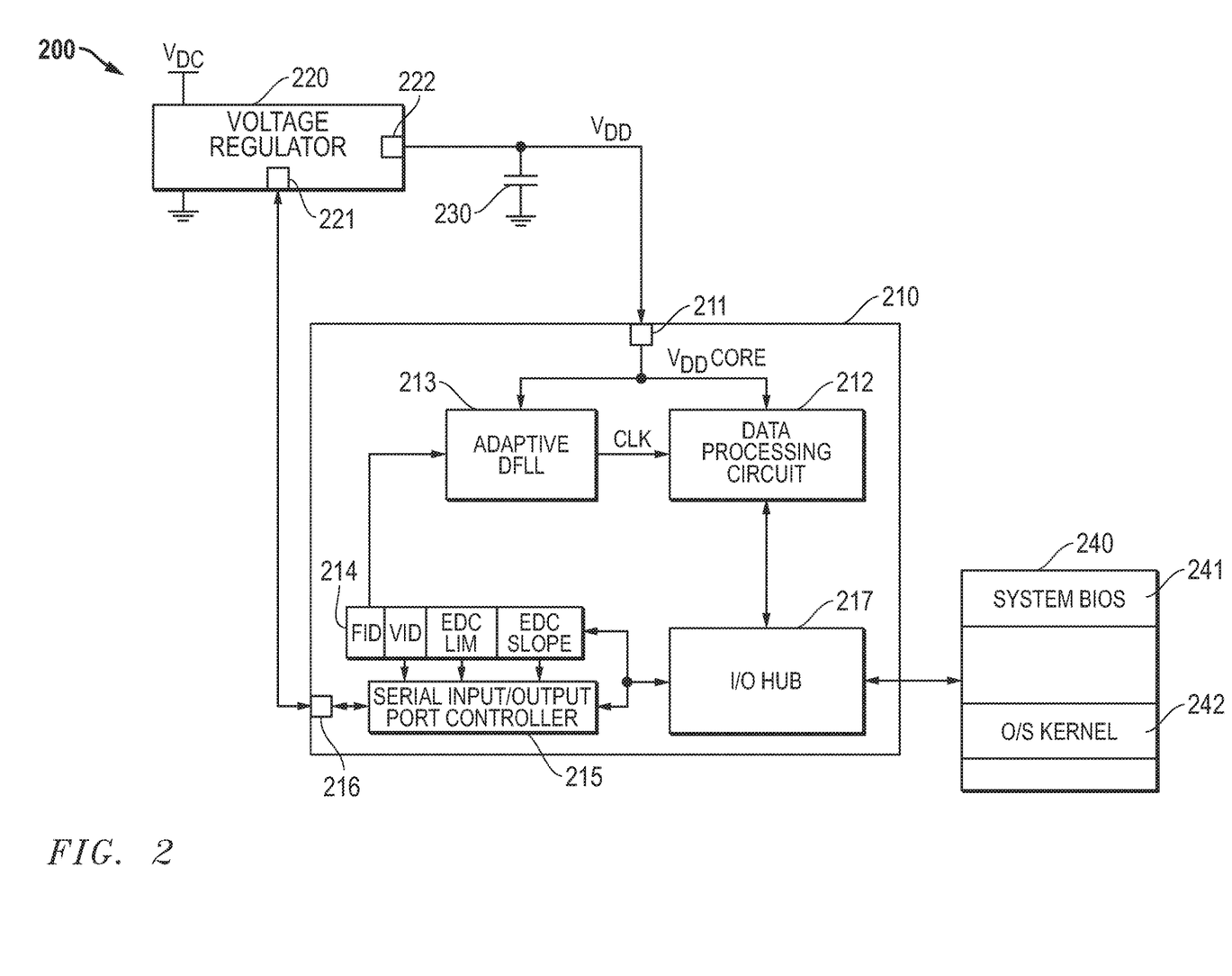
FIG. 2 illustrates in partial block diagram and partial schematic form a data processing system according to some embodiments.

As will be described in detail below, a data processor (210) includes at least one power supply voltage terminal (211) for receiving a power supply voltage and through which a power supply current is conducted, a data processing circuit, a register, and a port controller. The data processing circuit (212) is coupled to the at least one power supply voltage terminal (211) and operates using the power supply voltage. The register stores a nominal value of the power supply voltage, an electrical design current (EDC) limit, and an EDC slope, wherein the EDC slope specifies a desired voltage-current relationship for an external voltage regulator (220) when the power supply current exceeds the EDC limit. The port controller (215) is coupled to the register (214) and to an output port (216). The data processing circuit (212) is operative to cause the port controller (215) to output the nominal value of the power supply voltage, the EDC limit, and the EDC slope over the output port (216) for use by the external voltage regulator (220).

A data processing system includes a data processor and a voltage regulator. The data processor operates in response to a power supply voltage, and includes at least one power supply voltage terminal (211) for receiving the power supply voltage and through which a power supply current is conducted, a data processing circuit (212) coupled to the at least one power supply voltage terminal (211) and operating using the power supply voltage, a register (214) for storing a nominal value of the power supply voltage, an electrical design current (EDC) limit, and an EDC slope, wherein the EDC slope specifies a desired voltage-current relationship of the power supply voltage when the power supply current exceeds the EDC limit, and a port controller (215) coupled to the register (214) and to an output port (216). The data processing circuit (212) is operative to cause the port controller (215) to output the nominal value of the power supply voltage, the EDC limit, and the EDC slope over the output port (216). The voltage regulator (220) is coupled to the output port (216) of the data processor (216) for providing the power supply voltage according to the nominal value of the power supply voltage, the EDC limit, and the EDC slope.

A data processing system (200) includes a data processor (210) and a voltage regulator. The data processor has at least one power supply voltage terminal (211) for receiving a power supply voltage and supplying a power supply current. The data processor (210) operates in response to a clock signal and includes an adaptive clock generator (213) that provides the clock signal at a nominal frequency when the power supply voltage is at or above a nominal value, and reduces a frequency of the clock signal in response to a droop in the power supply voltage below the nominal value. The voltage regulator (220) is coupled to the power supply voltage terminal and provides the power supply voltage thereto. When the power supply current is above an electrical design current (EDC) limit, the voltage regulator (220) reduces the power supply voltage from the nominal value of the power supply voltage according to the power supply current at a slope determined by an EDC slope.

A method includes powering a data processor (210) with a power supply voltage having a power supply current associated therewith. A nominal value of the power supply voltage, an electrical design current (EDC) limit, and an EDC slope are stored in a register (214). The EDC slope specifies a desired voltage-current relationship for an external voltage regulator (220) when the power supply current exceeds the EDC limit. The nominal value of the power supply voltage, the EDC limit, the EDC slope are outputted from the register (214) using an output port (216) of the data processor (210) for use by the external voltage regulator (220).

Figure 1:
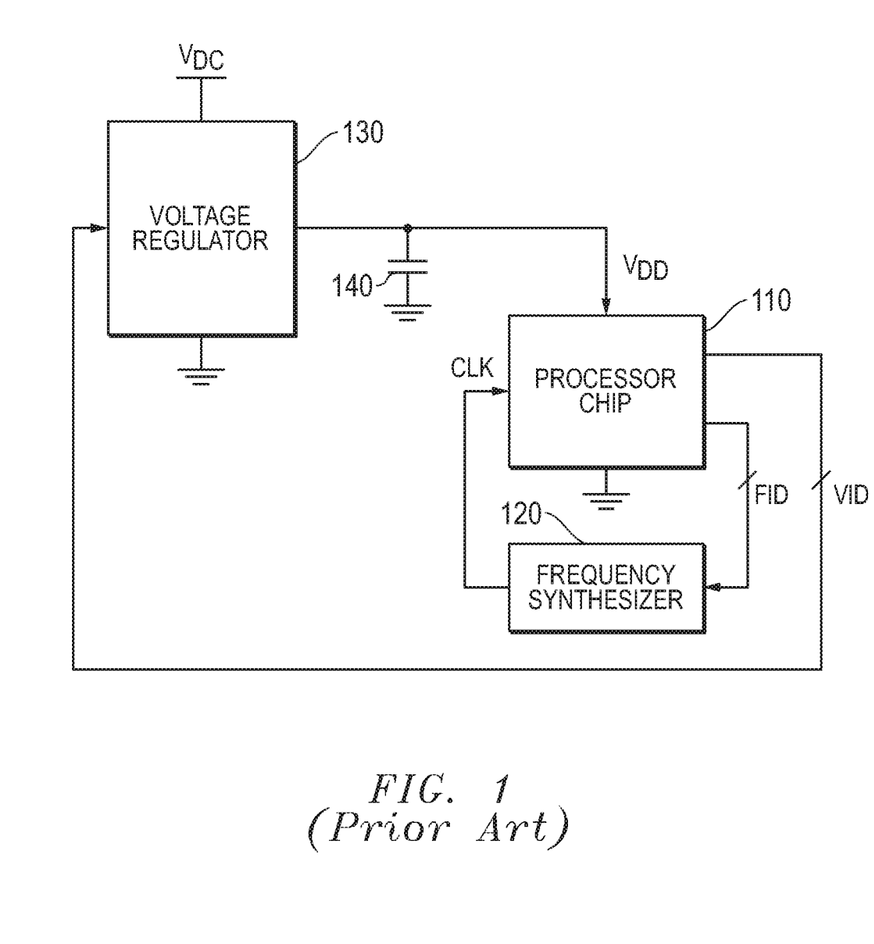
FIG. 1 illustrates in partial block diagram and partial schematic form a data processing system known in the prior art.

FIG. 1 illustrates in partial block diagram and partial schematic form a data processing system 100 known in the prior art. Data processing system 100 includes a processor chip 110, a frequency synthesizer 120, a voltage regulator 130, and an output capacitor 140. Processor chip 110 has a power supply terminal for receiving a voltage labeled "$V_{DD}$", a ground terminal connected to ground, an input for receiving a clock signal labeled "CLK", a first output for providing a multibit digital signal labelled "VID", and a second output for providing a multibit digital signal labelled "FID". Frequency synthesizer 120 has an input connected to the second output of processor chip 110, and an output connected to the input of processor chip 110 for providing the CLK signal thereto. Voltage regulator 130 has a power supply terminal for receiving a power supply voltage labelled "$V_{DC}$", a ground terminal connected to ground, an input connected to the first output of processor chip 110 for receiving the VID signal, and an output connected to the power supply terminal of processor chip 110 for providing power supply voltage $V_{DD}$ thereto. Output capacitor 140 has a first terminal connected to the output terminal of voltage regulator 130, and a second terminal connected to ground.

Processor chip 110 provides the VID and FID signals as part of digital voltage and frequency scaling (DVFS) in order to match clock frequency, and therefore performance, with processing workload. Typically, processor chip 110 will transition between an active state and various low-power states. Within the active state, processor chip 110 supports various performance states or "P-states" in which processing capability can be scaled up and down to match the current workload. Processor chip 110 can measure its own workload. For example, it can estimate its workload based on the utilization of various processor resources. If the processing workload is too high at the current clock frequency, then it increases the P-state to increase the clock frequency and increase performance. Conversely if the processing workload is too low at the current clock frequency, then it decreases the P-state to decrease the clock frequency and save power. Each P-state is defined by a unique clock frequency and power supply voltage pair, in which the power supply voltage is large enough to ensure correct processor operation at the corresponding clock frequency. Processor chip 110 sets the frequency of the CLK signal output by frequency synthesizer 120 using the FID signals, and the level of power supply voltage $V_{DD}$ provided by voltage regulator 130 using the VID signals. Typically in response to a P-state change request to a higher P-state, processor chip 110 increases the value of $V_{DD}$ before increasing the frequency of the CLK signal, and in response to a P-state change request to a lower P-state, processor chip 110 decreases the frequency of the CLK signal before decreasing the value of $V_{DD}$. These sequencing rules ensure proper operation during P-state changes.

Voltage regulator 130 converts an unregulated direct current (DC) voltage $V_{DC}$ into a stepped down, programmable, regulated voltage $V_{DD}$. Voltage regulator 130 is typically implemented as a switched mode power supply (SMPS) converter for better conversion efficiency at heavier loads.

Because of the bursty nature of processing workloads and the speed at which voltage regulator 130 adjusts to changes in load, power supply voltage $V_{DD}$ at the output of voltage regulator 130 can experience voltage droop, in which the voltage level decreases in response to a sudden increase in loading. Since P-state changes instituted by the operating system and use voltage regulators and variable frequency clock generators that have significant latencies, the P-state mechanism is inadequate to adjust for voltage droops. Thus, voltage droop can cause the operations of processor chip 110 to fail before the operating system can react by increasing the P-state of processor chip 110.

An existing mechanism for automatically adjusting for power supply voltage droop without using the P-state mechanism is known as the processor clocking control (PCC) mechanism. This mechanism detects an overcurrent event and directly reduces the frequency of the clock signal when an overcurrent threshold has been crossed. Current can be measured using on-die dynamic capacitance ("$C_{AC}$") accumulators that estimate the data processor's dynamic capacitance. The dynamic capacitance can then be used to estimate processor current according to the following equation:

$$I = C_{AC} \times V \times f \qquad [2]$$

However, the $C_{AC}$ mechanism requires extensive tuning of each data processor chip after manufacturing, and suffers from low accuracy. Moreover, the PCC mechanism is too slow to accommodate typical voltage droops. For example, it may take the PCC mechanism around 100 nanoseconds (ns) to adjust the clock frequency, which is a significant number of clock periods in a system that uses, e.g., a 2.0 gigahertz (GHz) clock signal.

FIG. 2 illustrates in partial block diagram and partial schematic form a data processing system 200 according to some embodiments. Data processing system 200 includes generally a data processor chip 210, a voltage regulator chip 220, a capacitor 230, and a memory 240.

Data processor chip 210 includes an external terminal 211, a data processing circuit 212, an adaptive digital frequency locked loop (DFLL) 213, a register 214, a serial input/output (I/O) port controller 215, an external terminal 216, and an input/output (I/O) hub 217. External terminal 211 is a die bonding pad or integrated circuit terminal that receives power supply voltage $V_{DD}$. Data processing circuit 212 has a first input connected to external terminal 211 for receiving an internally-routed version of $V_{DD}$ labelled "$V_{DD}$ CORE", a second input for receiving the CLK signal, a bidirectional downstream terminal, and other terminals not specifically shown in FIG. 2. These other terminals are conventional terminals not relevant to the understanding of the present disclosure and they will not be discussed further. Adaptive DFLL 213 has a first input connected to external terminal 211, a second input, and an output connected to the second input of data processing circuit 212. Register 214 has an input and a set of outputs corresponding to various fields that are described in TABLE I below:

TABLE I

| Field Name | Description |
| --- | --- |
| FID | Frequency identification. The FID field indicates the programmed frequency of adaptive DFLL 213. |
| VID | Voltage identification. The VID field indicates the value of the power supply voltage provided by voltage regulator chip 220. |
| EDC LIM | Electric Design Current (EDC) limit. The EDC LIM field indicates a power supply current above which the external voltage regulator starts to reduce $V_{DD}$. |
| EDC SLOPE | EDC slope. The EDC SLOPE field indicates the amount of reduction of $V_{DD}$ per unit increase in the power supply current above the EDC LIM. |

Serial I/O port controller 215 has a bidirectional upstream port, a bidirectional downstream port, and inputs connected to the VID, EDC LIM, and EDC SLOPE fields of register 214. External terminal 216 is connected to the bidirectional downstream port of serial I/O port controller 215. I/O hub 217 has a bidirectional upstream port connected to the bidirectional downstream port of data processing circuit 212, a first bidirectional downstream port connected to register 214 and serial I/O port controller 215, and a second bidirectional downstream port.

Voltage regulator 220 has a power supply terminal for receiving power supply voltage $V_{DC}$, a ground terminal connected to ground, an input terminal 221 connected to external terminal 216 of data processor chip 210, and an output terminal 222 connected to external terminal 211 of data processor chip 210. Note that a typical integrated circuit data processor includes many power supply voltage terminals to lower the parasitic impedance between the output of the voltage regulator and the data processor chip, and thus external terminal 211 is representative of at least one power supply voltage terminal of data processor chip 210.

Capacitor 230 has a first terminal connected to output terminal 222 of voltage regulator chip 220, and a second terminal connected to ground.

Memory 240 has a bidirectional port connected to the second bidirectional downstream port of I/O hub 217. Memory 240 has a set of storage locations defining a memory map, including a first area 241 for storing a system basic input/output system (BIOS), and a second area 242 for storing an operating system (O/S) kernel.

In operation, data processing system 200 provides the ability to program the current-voltage (I/V) characteristics of voltage regulator chip 220 through a serial interface controlled by serial I/O port controller 215. The variable voltage provided by voltage regulator chip 220 works in conjunction with adaptive DFLL 213 to automatically reduce the frequency of the CLK signal according to a steep load line. These two mechanisms work in concert to ensure that data processing circuit 212 operates correctly even in the presence of a significant voltage droop.

Data processing circuit 212 can be any type of data processing circuit that operates to read, manipulate, operate on, process, and/or store data. In an exemplary embodiment, data processing circuit 212 is a graphics processing unit (GPU) core that operates according certain stored program instructions using, for example, the OpenGL programming language. The GPU core performs overall operations such as data input and output, shading, rendering, and rasterization using OpenGL primitives. Architecturally, the GPU core can be implemented using a massively parallel processor having a single instruction, multiple data (SIMD) architecture. In the course of performing graphics processing, the GPU core can process high numbers of these types of operations in parallel. In response to certain system events that cause a sudden increase in activity, a rapid increase in power supply current draw can cause a large power supply voltage droop.

In another embodiment, data processing circuit 212 can be a multi-core processor that performs the operations of a central processing unit (CPU) of data processing system 200. The CPU can run an operating system such as the Windows operating system licensed by Microsoft Corporation of Redmond, Wash. The multi-core CPU can experience long periods of relative dormancy, in which it is waiting for user input, followed by periods of intensive operation. In these circumstances, the CPU cores can require a sudden increase in power supply current that causes a large power supply droop.

In other embodiments, other types of data processors can be used, such as digital signal processors (DSPs), network processors, application specific processors, and the like. These processors can likewise experience sudden changes on power supply current resulting in power supply voltage droop.

Data processing circuit 212 typically includes a memory controller to connect to off-chip memory through a system controller hub, also known as a "Northbridge". Typically, data processing circuit 212 also has an input/output interface to memory 240, which can be a combination of non-volatile memory and bulk storage, which stores the system BIOS and the operating system kernel. Either or both of the system BIOS and the operating system kernel can store the parameters shown in TABLE I, and data processor chip 210 can access them through I/O hub 217 and store in register 214.

Adaptive DFLL 213 is a clock circuit that provides the CLK signal with a frequency that depends on the output voltage. During a voltage droop, adaptive DFLL 213 can reduce the frequency of the CLK signal. By reducing the frequency of the CLK signal during power supply voltage droop, adaptive DFLL 213 ensures that data processing circuit 212 continues to operate properly at the lower voltage, and then recovers as voltage regulator chip 220 compensates $V_{DD}$ for the higher current level.

Serial I/O port controller 215 can control communications for any suitable parallel or serial communications protocol. Thus, external terminal 216 is representative of one or more terminals that may be involved in the data transfer. In one particular embodiment, serial I/O port controller operates using the serial voltage identification (SVID) protocol specified by the Intel Corporation of Santa Clara, Calif.

Figure 3:
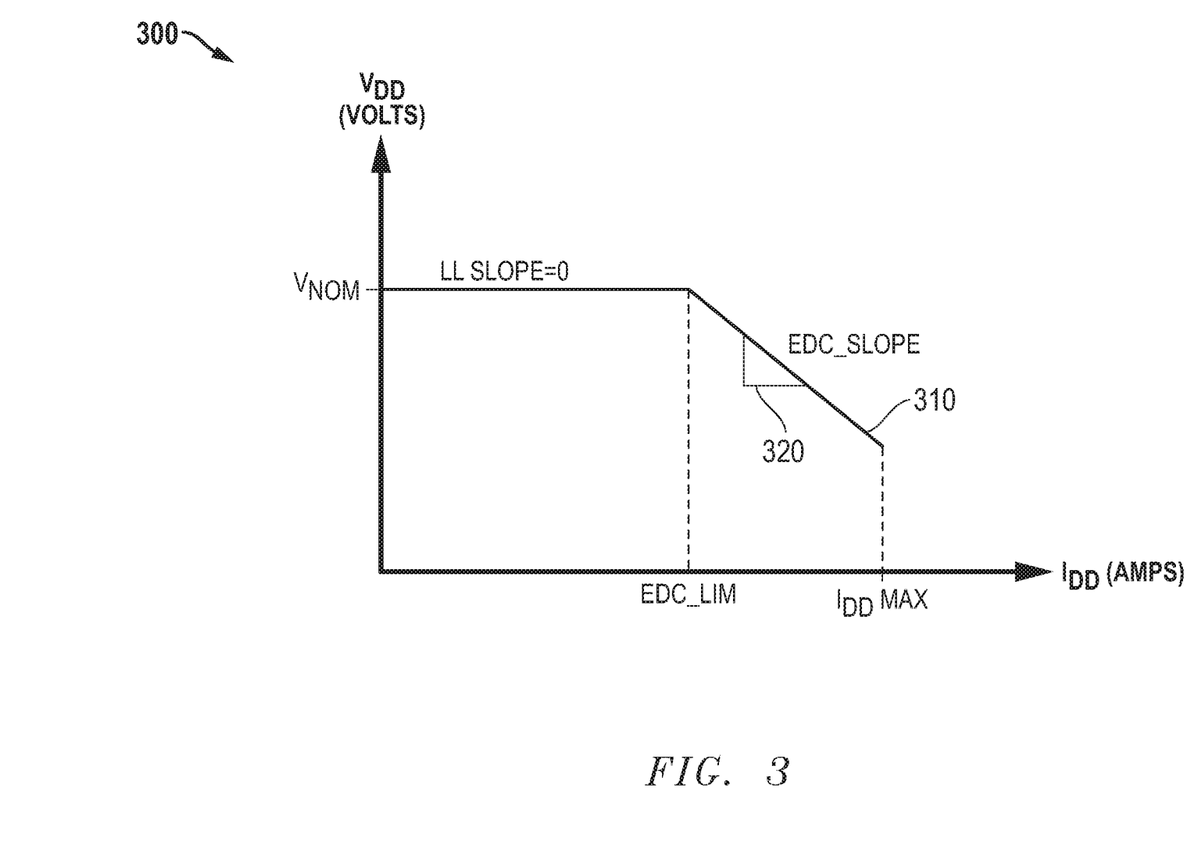
FIG. 3 illustrates a graph of a current-voltage response of the voltage regulator chip of FIG. 2.

FIG. 3 illustrates a graph 300 of the current-voltage response of voltage regulator chip 220 of FIG. 2. In graph 300, the horizontal axis represents power supply current labeled "$I_{DD}$" in amperes, and the vertical axis represents power supply voltage $V_{DD}$ in volts. Along the horizontal axis, graph 300 shows a value of $I_{DD}$ corresponding to the EDC LIM, and a maximum supported power supply current labeled "$I_{DDMAX}$". Along the vertical axis, graph 300 shows a value of $V_{DD}$ labeled "$V_{NOM}$". $V_{NOM}$ is the nominal value of $V_{DD}$ corresponding to the VID value. Graph 300 also shows a waveform 310 of power supply voltage $V_{DD}$ for different values of power supply current $I_{DD}$. As shown by waveform 310, for all values of $I_{DD}$ less than EDC LIM, the value of $V_{DD}$ is equal to $V_{NOM}$. The rate of change of $V_{DD}$ with respect to changes in $I_{DD}$ for values of $I_{DD}$ less than or equal to EDC LIM is called the load line slope, or "LL SLOPE". As shown in graph 300, the LL SLOPE is equal to 0. For values of $I_{DD}$ above the EDC LIM, $V_{DD}$ decreases at a rate of EDC SLOPE per unit of $I_{DD}$, as shown by slope 320, until power supply current $I_{DD}$ reaches $I_{DDMAX}$.

Figure 4:
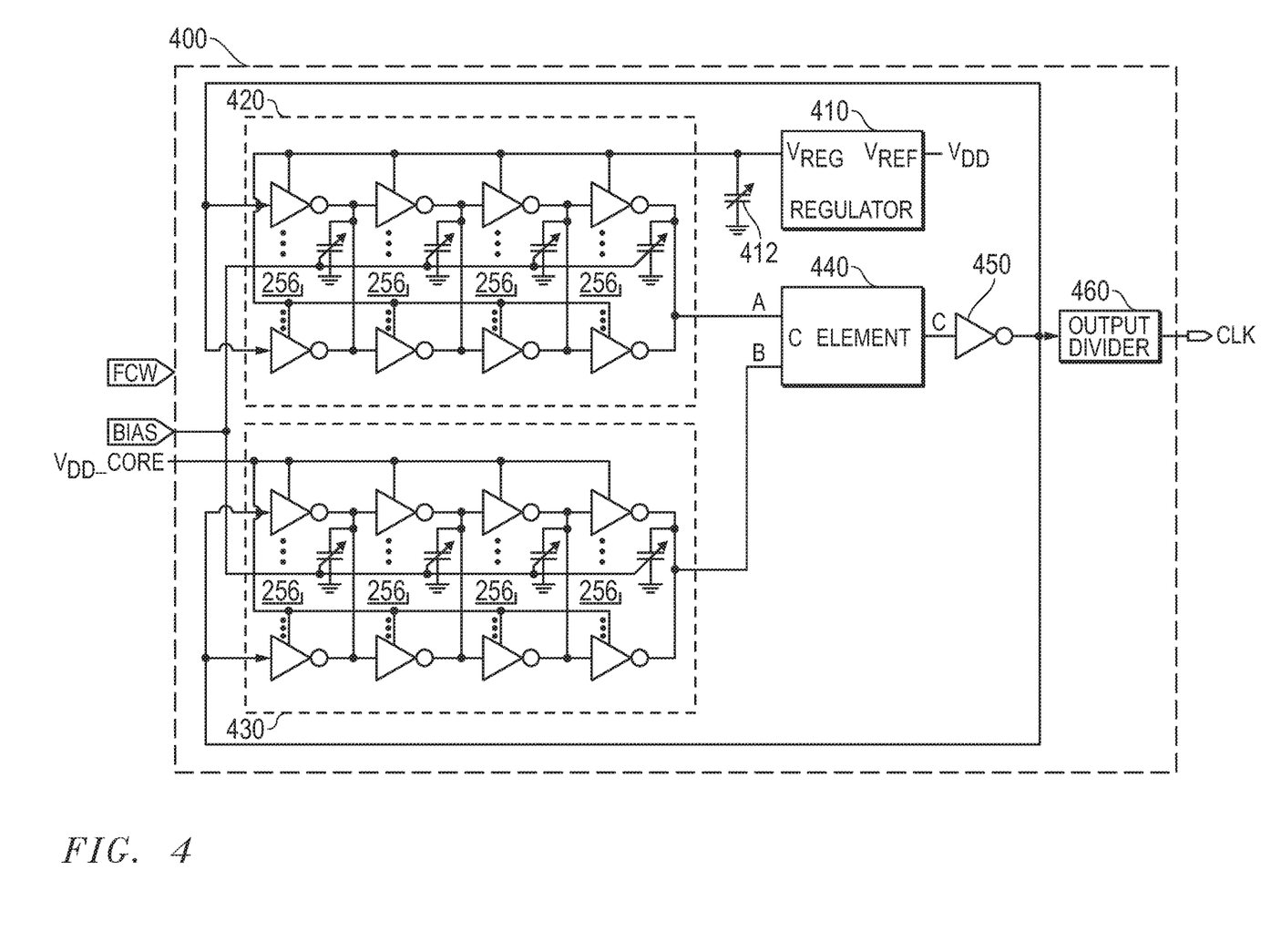
FIG. 4 illustrates in partial block diagram and partial schematic form a master-slave digital frequency locked loop (DFLL) that can be used as the adaptive DFLL of FIG. 2 according to some embodiments.

FIG. 4 illustrates in partial block diagram and partial schematic form a master-slave digital frequency locked loop (DFLL) 400 that can be used as the adaptive DFLL 213 of FIG. 2 according to some embodiments. Master-slave DFLL 400 has an input for receiving an input voltage labeled "VDD_CORE", an input for receiving a bias voltage labeled "BIAS", an input for receiving a frequency control word labeled "FCW", and an output for providing a clock signal labeled "CLK". Master-slave DFLL 400 includes generally a voltage regulator 410, a capacitor 412, a reference delay line 420, a droopy delay line 430, a coincidence element 440 labeled "C ELEMENT", an inverter 450, and an output divider 460.

Voltage regulator 410 has a reference input terminal labelled "$V_{REF}$" for receiving power supply voltage $V_{DD}$, and an output terminal labelled "$V_{REG}$". Capacitor 412 has a first terminal connected to the output terminal of voltage regulator 410, a second terminal connected to ground, and a control terminal.

Reference delay line 420 includes a set of rows of series connected inverters. Within each row, reference delay line 420 has a first inverter, a set of intermediate inverters, and a last inverter. The first inverter has a power supply voltage terminal connected to the $V_{REG}$ output of voltage regulator 410, an input, and an output. Each intermediate inverter has a power supply voltage terminal connected to the $V_{REG}$ output of voltage regulator 410, an input connected to the output of a prior inverter, and an output. The last inverter has a power supply voltage terminal connected to the $V_{REG}$ output of voltage regulator 410, an input connected to an output of an intermediate inverter, and an output connected to a node labeled "A". Each intermediate node between two inverters in the chain has a corresponding capacitor having a first terminal connected to the intermediate node, a second terminal connected to ground, and a control terminal for receiving the BIAS voltage. The frequency control word selects which rows of reference delay line 420 are active.

Droopy delay line 430 also includes a set of rows of series connected inverters corresponding in number to the rows in reference delay line 420. Within each row, droopy delay line 420 has a first inverter, a set of intermediate inverters, and a last inverter. The first inverter has a power supply voltage terminal receiving the $V_{DD\_CORE}$ voltage, an input, and an output. Each intermediate inverter has a power supply voltage terminal receiving the $V_{DD\_CORE}$ voltage, an input connected to the output of a prior inverter, and an output. The last inverter has a power supply voltage terminal receiving the $V_{DD\_CORE}$ voltage, an input connected to an output of an intermediate inverter, and an output connected to a node labeled "B". Each intermediate node between two inverters in the chain has a corresponding capacitor having a first terminal connected to the intermediate node, a second terminal connected to ground, and a control terminal for receiving the BIAS voltage. The frequency control word selects which rows of droopy delay line 430 are active.

C element 440 has a first input connected to the A node, a second input connected to the B node, and an output for providing a signal labelled "C". Inverter 450 has an input connected to the output of coincidence element 440, and an output connected to the inputs of each first inverter in each row in reference delay line 420 and do the inputs of each first inverter in each row in droopy delay line 430. Output divider 460 has an input connected to the output of inverter 450, and an output for providing the CLK signal.

In operation, reference delay line 420 provides a delay set by the FCW and the BIAS voltage and that is substantially independent of the level of power supply voltage $V_{DD}$. However, droopy delay line 430 provides a delay set by the FCW and the BIAS voltage in the same manner of reference delay line 420, but also that is dependent on and proportional to the level of power supply voltage $V_{DD\_CORE}$. Thus, as $V_{DD\_CORE}$ droops due to a sudden increase in the size of the processor load, then the delay through droopy delay line 430 increase while the delay through reference delay line 420 remains substantially constant.

Coincidence element 440 is a signal coincidence element that provides the C output when the A and B outputs are in the same logic state, in this example at a logic high voltage. Inverter 450 provides its output to the inputs of each row in reference delay line 420 and droopy delay line 430 and adds an extra inversion around the loop, creating an odd number of delays and therefore oscillation. Output divider 460 divides the oscillating signal at the output of coincidence element 440 by a fixed or variable amount to provide the CLK signal.

Thus, if $V_{DD\_REG}$ is less than $V_{DD\_CORE}$, it will take longer for a transition in logic state at the input of the first inverter in each row in reference delay line 420 to propagate to the output, and C will not transition until the slower delay line, in this case, reference delay line 420, makes a transition to a logic high level. On the other hand, if $V_{DD\_CORE}$ is less than $V_{DD\_REG}$, it will take longer for a transition in logic state at the input of the first inverter in each row in droopy delay line 430 to propagate to the output, and C will not transition until the slower delay line, in this case, droopy delay line 430, makes a transition to a logic high level. Output divider 460 sets the frequency of the CLK to a fixed frequency determined by $V_{REG}$, or determined by $V_{DD\_CORE}$ if $V_{DD\_CORE}$ is less than $V_{REG}$, and thus slows down the CLK signal during a power supply voltage droop.

The automatic reduction in the CLK frequency ensures that the power supply voltage $V_{DD\_CORE}$ remains sufficient to allow correct operation. At the same time, it automatically returns the frequency of the CLK signal as the voltage regulator loop restores $V_{DD\_CORE}$ to a level appropriate for its current P-state. The automatic reduction is also very fast compared to the PCC mechanism, because the DFLL can respond to the voltage droop in as little as 25 picoseconds (ps).

Figure 5:
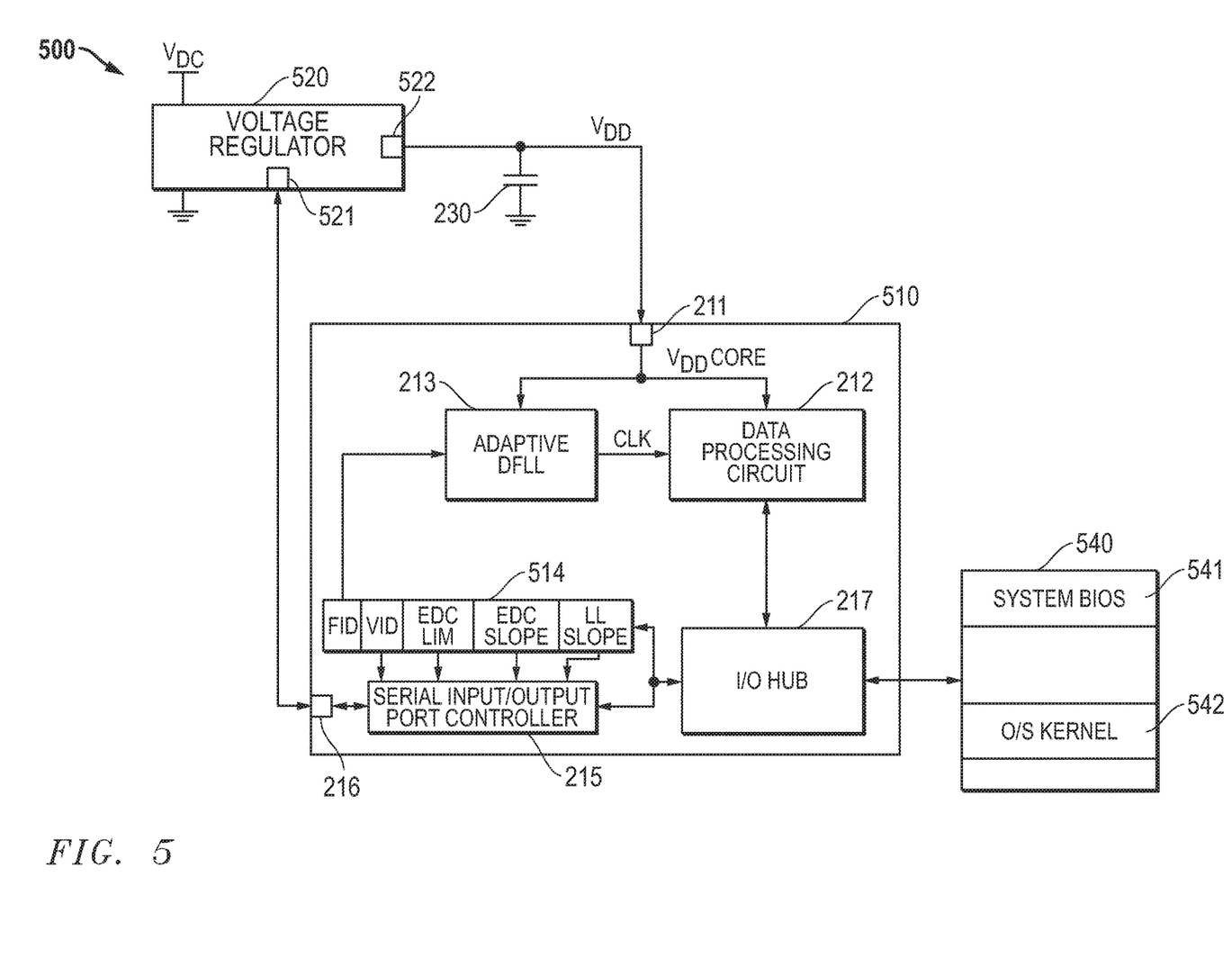
FIG. 5 illustrates in partial block diagram and partial schematic form another data processing system according to some embodiments.

FIG. 5 illustrates in partial block diagram and partial schematic form another data processing system 500 according to some embodiments. Data processing system 500 is similar to data processing system 200, except for two differences. First, a data processor chip 510 has a register 514 that includes an additional field, labelled "LL SLOPE", and as will be explained further below, provides an additional boost in power supply voltage $V_{DD}$ as power supply current decreases below the EDC_LIM value. Serial I/O port controller 215 further provides this value on external terminal 216. The various fields of register 514 are described in TABLE II below:

TABLE II

| Field Name | Description |
|---|---|
| FID | Frequency identification. The FID field indicates the programmed frequency of adaptive DFLL 213. |
| VID | Voltage identification. The VID field indicates the value of the power supply voltage provided by voltage regulator chip 520. |
| EDC LIM | Electric Design Current (EDC) limit. The EDC_LIM field indicates a power supply current above which the external voltage regulator starts to reduce $V_{DD}$. |
| EDC SLOPE | EDC slope. The EDC SLOPE field indicates the amount of reduction of $V_{DD}$ per unit increase in the power supply current above the EDC_LIM. |
| LL SLOPE | Load line slope. The LL SLOPE field indicates the amount of increase of $V_{DD}$ per unit decrease in the power supply current below the EDC_LIM. |

Second, a voltage regulator 520 includes additional functionality compared to voltage regulator 220 of FIG. 2. Voltage regulator 520 has a power supply terminal for receiving power supply voltage $V_{DC}$, a ground terminal connected to ground, an input terminal 521 connected to external terminal 216 of data processor chip 210, and an output terminal 522 connected to external terminal 211 of data processor chip 210. Voltage regulator 520 operates similarly to voltage regulator 220 of FIG. 2, except that voltage regulator 520 is further responsive to the LL SLOPE value, as will now be explained.

Figure 6:
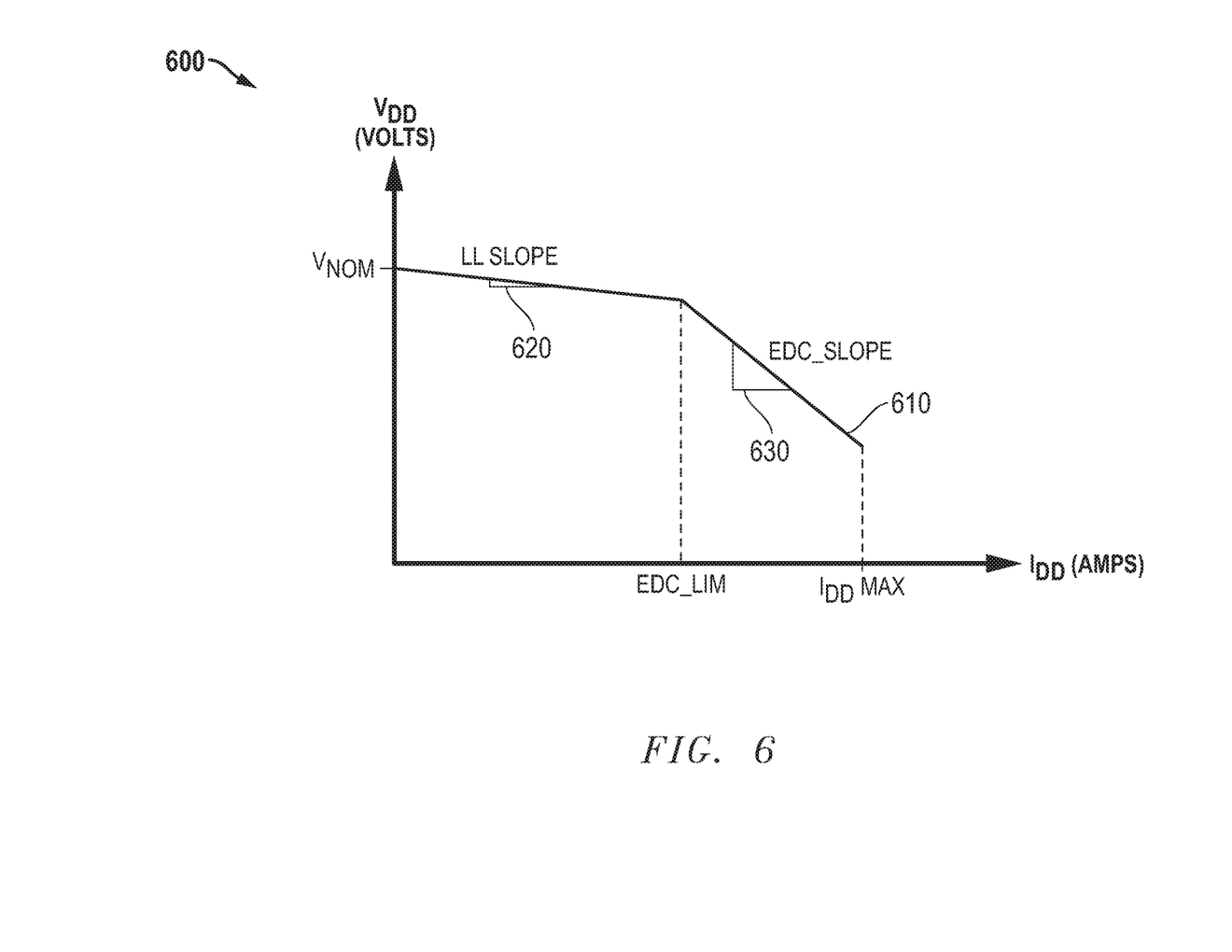
FIG. 6 illustrates a graph of a current-voltage response of the voltage regulator chip of FIG. 5.

FIG. 6 illustrates a graph 600 of a current-voltage response of voltage regulator chip 520 of FIG. 5. In graph 600, the horizontal axis again represents power supply current $I_{DD}$ in amperes, and the vertical axis represents power supply voltage $V_{DD}$ in volts. Shown in FIG. 6 along the horizontal axis is a value of $I_{DD}$ corresponding to the EDC_LIM, and a maximum supported power supply current $I_{DDMAX}$. Shown along the vertical axis is a value of $V_{DD}$ labeled $V_{NOM}$. $V_{NOM}$ is the nominal value of $V_{DD}$ corresponding to the VID value. Graph 600 also shows a waveform 610 of power supply voltage $V_{DD}$ for different values of power supply current $I_{DD}$. Waveform 610 is similar to waveform 310 of FIG. 3, except for one difference. As shown by waveform 610, for all values of $I_{DD}$ less than EDC_LIM, the value of $V_{DD}$ is not constant, but is equal to $V_{NOM}$ minus an amount determined by a non-zero LL SLOPE. As shown in graph 600, the value of LL SLOPE is much less than the value of EDC SLOPE. The rate of change of $V_{DD}$ with respect to changes in $I_{DD}$ for values of $I_{DD}$ less than or equal to EDC_LIM, i.e. LL SLOPE, is significantly smaller than EDC_SLOPE, as shown by slopes 620 and 630. The non-zero LL SLOPE is able to account for the much smaller component of $I_{DD}$ that is due to leakage power (in very low power states) and clock distribution power (in small latency low-power states).

A data processing system and data processor as disclosed herein allow the data processor to programmably set the characteristics of a voltage regulator using values communicated over an output port. It also avoids the need for extensive post-manufacturing tuning or large on-die circuits to measure capacitance and power supply current. In one form, the data processor programs an EDC limit and EDC slope of the voltage regulator using an output port. In another form, the data processor sets the EDC limit and the EDC slope as well as a load line slope, in which the load line slope describes the power supply current/voltage relationship when the voltage regulator operates below the EDC limit. Thus, data processor controls the voltage regulator itself to shape its power supply current/power supply voltage characteristic for the needs of the specific data processor. In some embodiments, the data processor includes an adaptive clock generator that detects the power supply voltage droop and automatically reduces the clock frequency to prevent the droop from causing circuit failure. These two mechanisms work together to implement a steep power supply current/ power supply voltage load line beyond the EDC limit.

Data processing systems 200 and 500, data processor chips 210 and 510, or any portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the slope of the power supply current-voltage load lines can either be zero or a non-zero value. The disclosed data processors can communicate with their respective voltage regulator chips using various known parallel or serial protocols, including the SVID protocol, the serial interface protocol marketed by the registered trademark I²C Bus owned by NXP Semiconductor B.V. Corporation Netherlands, Eindhoven, the Netherlands, a serial communications interface (SCI) bus, and the like. Also, the values used to specify the performance of the external voltage regulator can be stored or determined by the system BIOS, the operating system kernel, or application software.

Accordingly, it is intended by the appended claims to cover all modifications of the disclosed embodiments that fall within the scope of the disclosed embodiments.

What is claimed is:

1. A data processor comprising:
   at least one power supply voltage terminal for receiving a power supply voltage and through which a power supply current is conducted;
   a data processing circuit coupled to said at least one power supply voltage terminal and operating using said power supply voltage;

a register for storing a nominal value of said power supply voltage, an electrical design current (EDC) limit, and an EDC slope, wherein said EDC slope specifies a desired voltage-current relationship for an external voltage regulator when said power supply current exceeds said EDC limit; and a port controller coupled to said register and to an output port, wherein said data processing circuit is operative to cause said port controller to output said nominal value of said power supply voltage, said EDC limit, and said EDC slope over said output port for use by the external voltage regulator.

2. The data processor of claim 1, wherein said register further stores a load line slope, wherein said load line slope specifies the desired voltage-current relationship for the external voltage regulator when said power supply current is less than said EDC limit.

3. The data processor of claim 1, further comprising:
an adaptive clock generator that provides a clock signal at a nominal frequency when said power supply voltage is at or above said nominal value, and that reduces said a frequency of said clock signal in response to a droop in said power supply voltage below said nominal value,
wherein said data processing circuit operates according to both said power supply voltage and said clock signal.

4. The data processor of claim 3, wherein said adaptive clock generator is a master/slave digital frequency locked loop.

5. The data processor of claim 4, wherein said master/slave digital frequency locked loop comprises:
a voltage regulator having an input for receiving said power supply voltage, and an output for providing a regulated voltage;
a reference delay line for providing a first signal a first delay proportional to said regulated voltage after an edge of an output signal;
a droopy delay line for providing a second signal a second delay proportional to said power supply voltage after said edge of said output signal; and
a C-element having a first input for receiving said first signal, a second input for receiving said second signal, and an output for providing said output signal according to a latest transition of said first and second signals,
wherein said master/slave digital frequency locked loop provides said clock signal in response to said output signal.

6. The data processor of claim 3, wherein said data processing circuit determines said nominal value of said power supply voltage and said nominal frequency according to a requested power state (P-state).

7. The data processor of claim 1, wherein said data processing circuit comprises a graphics processing unit (GPU).

8. The data processor of claim 1, wherein said data processing circuit comprises a multi-core central processing unit (CPU).

9. A data processing system comprising:
a data processor operating in response to a power supply voltage, said data processor comprising;
at least one power supply voltage terminal for receiving said power supply voltage and through which a power supply current is conducted;
a data processing circuit coupled to said at least one power supply voltage terminal and operating using said power supply voltage;
a register for storing a nominal value of said power supply voltage, an electrical design current (EDC) limit, and an EDC slope, wherein said EDC slope specifies a desired voltage-current relationship of said power supply voltage when said power supply current exceeds said EDC limit; and
a port controller coupled to said register and to an output port,
wherein said data processing circuit is operative to cause said port controller to output said nominal value of said power supply voltage, said EDC limit, and said EDC slope over said output port, and
a voltage regulator coupled to said output port of said data processor for providing said power supply voltage according to said nominal value of said power supply voltage, said EDC limit, and said EDC slope.

10. The data processing system of claim 9, wherein said register further stores a load line slope, wherein said load line slope specifies the desired voltage-current relationship for said voltage regulator when said power supply current is less than said EDC limit.

11. The data processing system of claim 9, further comprising:
an adaptive clock generator that provides a clock signal at a nominal frequency when said power supply voltage is at or above said nominal value, and that reduces said a frequency of said clock signal in response to a droop in said power supply voltage below said nominal value,
wherein said data processing circuit operates according to both said power supply voltage and said clock signal.

12. The data processing system of claim 11, wherein said adaptive clock generator is a master/slave digital frequency locked loop.

13. The data processing system of claim 12, wherein said master/slave digital frequency locked loop comprises:
a regulator having an input for receiving said power supply voltage, and an output for providing a regulated voltage;
a reference delay line for providing a first signal a first delay proportional to said regulated voltage after an edge of an output signal;
a droopy delay line for providing a second signal a second delay proportional to said power supply voltage after said edge of said output signal; and
a C-element having a first input for receiving said first signal, a second input for receiving said second signal, and an output for providing said output signal according to a latest transition of said first and second signals,
wherein said master/slave digital frequency locked loop provides said clock signal in response to said output signal.

14. A data processing system comprising:
a data processor having at least one power supply voltage terminal for receiving a power supply voltage and supplying a power supply current, wherein said data processor operates in response to a clock signal and comprises:
an adaptive clock generator that provides said clock signal at a nominal frequency when said power supply voltage is at or above a nominal value, and reduces a frequency of said clock signal in response to a droop in said power supply voltage below said nominal value; and
a voltage regulator coupled to said power supply voltage terminal for providing said power supply voltage thereto, wherein when said power supply current is above an electrical design current (EDC) limit, said voltage regulator reduces said power supply voltage from said nominal value of said power supply voltage according to said power supply current at a slope determined by an EDC slope.

15. The data processing system of claim 14, wherein said adaptive clock generator is a master/slave digital frequency locked loop.

16. The data processing system of claim 15, wherein said master/slave digital frequency locked loop comprises:
a regulator having an input for receiving said power supply voltage, and an output for providing a regulated voltage;
a reference delay line for providing a first signal a first delay proportional to said regulated voltage after an edge of an output signal;
a droopy delay line for providing a second signal a second delay proportional to said power supply voltage after said edge of said output signal; and
a C-element having a first input for receiving said first signal, a second input for receiving said second signal, and an output for providing said output signal according to a latest transition of said first and second signals,
wherein said master/slave digital frequency locked loop provides said clock signal in response to said output signal.

17. The data processing system of claim 14, wherein said data processor determines said nominal value of said power supply voltage and said nominal frequency according to a requested power state (P-state).

18. The data processing system of claim 17, wherein:
said data processor further comprises:
a register for storing said nominal value of said power supply voltage, said EDC limit, and said EDC slope; and
a port controller coupled to said register and to an output port,
wherein said data processor is operative to cause said port controller to output said nominal value of said power supply voltage, said EDC limit, and said EDC slope over said output port, and
said voltage regulator comprises:
a first terminal coupled to said output port of said data processor; and
a second terminal coupled to said power supply voltage terminal of said data processor,
wherein said voltage regulator is responsive to said nominal value of said power supply voltage, said EDC limit, and said EDC slope received on said first terminal to provide said power supply voltage on said second terminal.

19. A method comprising:
powering a data processor with a power supply voltage having a power supply current associated therewith;
storing a nominal value of said power supply voltage, an electrical design current (EDC) limit, and an EDC slope in a register, wherein said EDC slope specifies a desired voltage-current relationship for an external voltage regulator when said power supply current exceeds said EDC limit; and
outputting said nominal value of said power supply voltage, said EDC limit, said EDC slope from said register using an output port of said data processor for use by the external voltage regulator.

20. The method of claim 19 further comprising:
storing a load line slope in said register, wherein said load line slope specifies the desired voltage-current relationship for the external voltage regulator when said power supply current is less than said EDC limit; and
outputting said load line slope from said register using said output port of said data processor for use by said external voltage regulator.

21. The method of claim 19, wherein powering said data processor comprises powering an integrated circuit data processor with said power supply voltage by providing said power supply voltage to at least one terminal of said integrated circuit data processor.

22. The method of claim 19, wherein storing said nominal value of said power supply voltage comprises fetching an initial nominal value of said power supply voltage while said data processor is running a basic input/output system (BIOS).

23. The method of claim 22, wherein storing said nominal value of said power supply voltage comprises fetching a subsequent nominal value of said power supply voltage in response to a power state change request provided by an operating system.

24. The method of claim 19, further comprising:
providing a clock signal at a nominal frequency to said data processor when said power supply voltage is at or above said nominal value; and
reducing a frequency of said clock signal in response to a droop in said power supply voltage below said nominal value.

25. A method comprising:
powering a data processor with a power supply voltage having a nominal value and a power supply current associated with said power supply voltage;
determining a value of said power supply voltage based on an electronic design current (EDC) limit and an EDC slope, wherein said EDC slope specifies a desired voltage-current relationship between said power supply current and said power supply voltage when said power supply current exceeds said EDC limit;
clocking said data processor with a clock signal; and
determining a frequency of said clock signal in response to said power supply voltage, wherein said determining comprises providing said clock signal at a nominal frequency when said power supply voltage is at or above said nominal value, and reducing said frequency of said clock signal in response to a droop in said power supply voltage below said nominal value.

26. The method of claim 25, wherein determining said frequency of said clock signal comprises determining said frequency of said clock signal using adaptive clock generator.

27. The method of claim 26, wherein determining said frequency of said clock signal using said adaptive clock generator further comprises determining said frequency of said clock signal using a master/slave digital frequency locked loop.

28. The method of claim 27, wherein determining said frequency of said clock signal using said master/slave digital frequency locked loop comprises:
regulating said power supply voltage to provide a regulated voltage;
delaying an edge of an output signal by a first amount proportional to said regulated voltage to provide a first signal;
delaying said edge of said output signal by a second amount proportional to said power supply voltage to provide a second signal;
providing said output signal according to a latest transition of said first and second signals; and providing said clock signal in response to said output signal.

29. The method of claim 25, further comprising:
determining said nominal value of said power supply voltage and said nominal frequency according to a requested power state (P-state).

30. The method of claim 25, further comprising:
storing said nominal value of said power supply voltage, said EDC limit, and said EDC slope in a register; and
outputting said nominal value of said power supply voltage, said EDC limit, said EDC slope from said register to an external voltage regulator using an output port of said data processor.

31. The method of claim 30, further comprising:
storing a load line slope in said register, wherein said load line slope specifies the desired voltage-current relationship for the external voltage regulator when said power supply current is less than said EDC limit; and
outputting said load line slope from said register using said output port of said data processor for use by said external voltage regulator.

\* \* \* \* \*